United States Patent [19]
Zaroubi et al.

[11] Patent Number: 6,094,050
[45] Date of Patent: Jul. 25, 2000

[54] MRI IMAGING WITH NOISE FILTERING IN WAVELET SPACE

[75] Inventors: Saleem Zaroubi, Nazareth; Gadi Goelman, Holon; Roland Chisin, Jerusalem, all of Israel

[73] Assignee: Hadasit Medical Research Services & Development Company Ltd., Jerusalem, Israel

[21] Appl. No.: 09/115,243

[22] Filed: Jul. 14, 1998

[51] Int. Cl.⁷ ........................................ G01V 3/00
[52] U.S. Cl. .................. 324/309; 324/307; 600/437; 600/453
[58] Field of Search ................... 382/131, 260, 382/276; 367/50; 600/437, 453; 324/309, 307, 303

[56] References Cited

U.S. PATENT DOCUMENTS 5,167,232  12/1992  Parker et al. ................... 128/653.3
5,841,890  11/1998  Kraske ............................ 382/131

OTHER PUBLICATIONS

Hilton et al, "Wavelet Denoising of Functional MRI Data", appeared in "Wavelet Applications in Biology and Medicine", Aldroubi & Unser, Eds., CRC Press, 1996.

*Primary Examiner*—Christine K. Oda
*Assistant Examiner*—Brij B. Shrivastav
*Attorney, Agent, or Firm*—Mark M. Friedman

[57] ABSTRACT

A method of imaging of an object. A plurality of image datasets, for example a real part and an imaginary part of a magnetic resonance image, are acquired, and are transformed separately to a transform space and filtered. The filtered datasets are inverse transformed and recombined nonlinearly to produce the final image. The preferred transformation is a wavelet transformation. Noisy transform coefficients are suppressed by thresholding.

7 Claims, 6 Drawing Sheets

MRI IMAGING WITH NOISE FILTERING IN WAVELET SPACE

FIELD AND BACKGROUND OF THE INVENTION

The present invention relates to magnetic resonance imaging and, more particularly, to a method of filtering noise from magnetic resonance images.

In the last decade Magnetic Resonance Imaging (MRI) has become a standard diagnostic imaging modality, that offers, for a full host of applications, high temporal and spatial resolution images that surpass in their quality those provided by other imaging techniques. Because of the high cost of MRI machine time and because of patient discomfort staying in the magnet for a long time, any reduction in acquisition time without compromising image quality is valuable. In order to improve data quality, one would like to increase the temporal and spatial resolutions beyond those achieved in the raw data.

The signal-to-noise ratio of MRI data has always been the limiting factor for higher spatial and temporal resolutions. Theoretically, the intrinsic spatial and temporal resolutions, constrained by the water apparent diffusion constants, are of the order of magnitude of a few microns and a few milliseconds. Practically however, the system's gradients strength and their rise time define the maximum resolution available in the data. With the constant improvement of these two parameters, the operative limit to the resolution is determined by the image signal-to-noise ratio. Because of the averaging procedure applied to the data, there is a trade off between the spatial resolution and the temporal resolution of the image.

In the emerging field of functional MRI to study the human brain, improving the signal-to-noise ratio is even more important. In these studies, high temporal resolution is desired, which makes a signal averaging procedure improper.

Recovery of an image from noisy MR data is a classic problem of inversion. A straightforward inversion often is unstable and a regularization or image processing scheme of some sort, in order to interpolate where data are noisy, is essential. Image processing spans a variety of methods, starting from the classical, e.g. Wiener filtering and Principal Component Analysis, to the more modem, and usually non-linear, methods, such as Artificial Neural Networks, Maximum-Entropy, and Wavelets analysis. All of these methods attempt, subject to some assumptions, to extract the maximum amount of "useful" information content from the image.

In many of those methods the data are expanded in some functional basis that maintains their phase distribution as well as their power spread over various scales, i.e. power spectrum. With a clever choice of functional basis, it often is possible to distinguish between the various contributions to MRI data. Such a distinction facilitates filtering of undesired contributions, e.g. noise.

During the last decade wavelets have become a popular tool in various data analysis and signal and image processing applications. Wavelet functional bases' main appeal stems from their simultaneous localization in both the wavenumber (frequency) and the position (time) domains, where they allow for an orthogonal and complete projection on modes localized in both physical and transform spaces, therefore make possible a multi-resolution analysis of images. The localization allows for compressing the noiseless image features into a very small number of very large wavelet coefficients. Gaussian white noise, however, stays as white noise in any orthogonal basis, therefore spreading in wavelet space over all expansion coefficients and contributing to each of them a relatively small amplitude. Consequently, in a wavelet basis, the noiseless signal dominated coefficients can be easily singled out from their noise dominated counterparts.

In summary, decomposition via wavelets has two main advantages: First, it maintains spatial (temporal) as well as characteristic wavenumber (frequency) information. Second, many classes of functions can be expanded in a relatively small number of wavelet basis functions while keeping most of their information content. These two properties make wavelets an excellent tool for noise filtering and data compression A particularly popular class of wavelet functional bases is the computationally efficient, discrete wavelet transforms (DWT).

SUMMARY OF THE INVENTION

According to the present invention there is provided a method of imaging of an object, including the steps of: (a) acquiring a plurality of image datasets of the object; (b) for each of the image datasets: (i) transforming the each image dataset to a transform space, thereby providing a transformed image dataset, (ii) filtering the each transformed image dataset, thereby providing a filtered transformed image dataset, and (iii) inverting the transformation of the each filtered transformed image dataset; and (c) combining the inverted filtered transformed image datasets nonlinearly to produce an output image.

The scope of the present invention includes all imaging methods in which a plurality of image datasets are acquired and then combined in a nonlinear manner to produce an output image. The particular type of imaging illustrated herein is magnetic resonance imaging, in which there are two such image datasets, specifically, a real part and an imaginary part of a magnetic resonance image. The output image is the absolute value of the input datasets, i.e., the square root of the sum of the squares of the input datasets.

Although the present invention is illustrated herein with experimentally acquired images of a rat brain, and although the primary envisaged application of the present invention is to human patients, it is to be understood that the present invention is applicable to imaging any object that can be imaged by methods such as MRI.

In the particular imaging modality used herein to illustrate the present invention, the input to the algorithm of the present invention is an MR image after Fourier transformation, i.e., an X-dimensional dataset, modeled mathematically as $$I^{obs}=I+\epsilon \qquad (1)$$

where I is the underlying local signal and $\epsilon$ is the statistical uncertainty, assumed to be Gaussian white noise. X may be 1, 2, or 3; but typically, X is 2, and the input dataset is a set of N×N observations. For convenient application of a discrete wavelet transform, as described below, N should be a power of 2 ($N=2^{J+1}$). In that case, I and $\epsilon$ are functions of grid coordinates $(x_i,y_j)$, $1 \leq i \leq N$, $1 \leq j \leq N$.

After Fourier transformation, an MRI dataset has both a real part and an imaginary part. The decomposition of Equation (1) and the Gaussian white noise assumption apply to the real and imaginary parts separately. According to the present invention, noise filtering is applied to the real part and the imaginary part of the image separately. An MR image, as displayed, is the absolute value of the real and imaginary parts. Taking the absolute value couples the signal I to the noise $\epsilon$. Consider a complex data point $c=(a\pm\epsilon_1)+i(b\pm\epsilon_2)$, where $\epsilon_1$ and $\epsilon_2$ are the errors in each component and i is the square root of $-1$. The absolute value of c is:

$$|c| = \sqrt{a^2 + b^2 \pm 2a\varepsilon_1 \pm 2b\varepsilon_2 + \varepsilon_1^2 + \varepsilon_2^2} \quad (2)$$

which includes the coupling term $\pm 2a\epsilon_1 \pm 2b\epsilon_2$. Therefore, filtering the combined (absolute value) MR image is less effective than filtering the real and imaginary parts separately. Michael Hilton et al. (M. Hilton, T. Ogden, D. Hattery, G. Eden and B. Jawerth, "Wavelet denoising of functional MRI data", in *Wavelet Applications in Biology and Medicine*, A. Aldroubi and M. Unser, eds., CRC Press, 1996, pp. 93–114) reported wavelet domain filtering of absolute value MR images. The superiority of the present invention over this prior art method is demonstrated below.

According to the present invention, the real and imaginary parts of the MR image are transformed from position space to a transform space, preferably wavelet space, filtered in the transform space, and transformed back (inverted) to position space. Although wavelet transforms are the preferred transformations, the scope of the present invention includes all applicable transformations, for example, Fourier transforms (in addition to those normally performed on MRI data) and Walsh transforms. Note that the terms "space" and "domain" are used interchangeably herein. In dynamic studies, e.g., functional MRI, transform domain filtering increases the signal-to-noise ratio without reducing temporal resolution. It also enables shortening of image acquisition time in routine clinical MRI, hence lowering imaging cost and patient discomfort.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a method of acquiring and processing MR images. Specifically, the present invention can be used to reduce the acquisition time of MR images of a given signal-to-noise ratio, or, alternatively, to acquire MR images of higher signal-to-noise ratio in the same acquisition time.

The principles and operation of MRI data acquisition and processing according to the present invention may be better understood with reference to the drawings and the accompanying description.

The 1-dimensional wavelet functional basis is obtained by defining the so-called mother and scaling functions, respectively denoted as $\psi(x)$ and $\phi(x)$, with $0 \leq x \leq L$, where L is the field of view length. Specific $\psi$ and $\phi$ functions are chosen from a full host of wavelet families. Translation and dilation of the scaling and mother functions construct the functional basis, i.e. each basis function is given as $$\psi\left(\frac{x-b}{a}\right)$$

and $$\varphi\left(\frac{x-b}{a}\right)$$

where a is real and positive and b is real.

Discrete wavelet functional bases are derived by setting $a=2^{-j}$ and $b=2^j k$, so that each wavelet function is given as $$\psi_{j,k}(x) = \left(\frac{2^j}{L}\right)^{1/2} \psi(2^j x/L - k) \quad (3a)$$

and $$\varphi_{j,k}(x) = \left(\frac{2^j}{L}\right)^{1/2} \varphi(2^j x/L - k) \quad (3b)$$

where $0 \leq j \leq J-1$, $0 \leq k \leq 2^J-1$, and the integers j and k determine the resolution and location of each function respectively. J sets the maximum amount of resolution. Like the fast Fourier transform, the DWT assumes periodic boundary conditions and operates on a data vector whose length is an integral power of 2.

At each resolution level wavelet functions satisfy the orthogonality conditions, $$\int_0^L \varphi_{j',k'}(x) \varphi_{j,k}(x) dx = \delta^K_{j',j} \delta^K_{k',k} \quad (4a)$$

where by $\delta^K_{j',j}$ is the Kronecker delta. For a given level j, $\phi_{j,k}$ is also orthogonal to $\psi_{j',k}$ functions with $j' \leq j$, i.e., $$\int_0^L \psi_{j',k'}(x)\varphi_{j,k}(x)dx = 0 \quad \text{if } j' \le j \tag{4b}$$

The most preferred wavelet family is the Daubechies family (I. Daubechies, "Ten lectures on wavelets", CBMS-NSF *Regional Conference Series in Applied Mathematics,* Vol. 61, Society for Industrial and Applied Mathematics, Philadelphia Pa., 1992). In addition to being orthogonal, this family is continuous, has compact support and admits fractal structure. Each member of the Daubechies family is distinguished by the number of wavelet filter coefficients. These coefficients define the wavelet mother and scaling functions according to two recursive equations:

$$\psi(\eta) = \sum_i a_i \psi(2\eta - i) \tag{5a}$$

and $$\varphi(\eta) = \sum_i b_i \psi(2\eta + i) \tag{5b}$$

where $\eta = 2^j x/L$ and $b_i = (-1)^i a_{i-1}$. The number of filter coefficients determines the compactness of the wavelet mother and scale functions. Compactness of wavelet function comes on the expense of their smoothness, e.g., the most localized and least smoothed member of the Daubechies family is DAUB4 which has four coefficients (17). In the examples presented herein, the DAUB20 functional basis is used.

A function $p(x)$, defined over a finite region $0 \le x \le L$ and obeying periodic boundary conditions, is expanded with DWT as $$\rho(x) = c_{0,0}\psi_{0,0}(x) + \sum_{j=0}^{J-1}\sum_{k=0}^{2^j-1} \tilde{c}_{j,k}\varphi_{j,k}(x) \tag{6}$$

where the coefficients $c_{0,m}$ and $\tilde{c}_{j,k}$ are calculated by the inner products $$c_{0,0} = \int_0^L \rho(x)\psi_{0,0}(x)dx \tag{7a}$$

and $$\tilde{c}_{j,k} = \int_0^L \rho(x)\varphi_{j,k}(x)dx \tag{7b}$$

The one dimensional expansion rule, depicted in Equation (6), can be easily generalized to n-dimensional functions (W. H. Press, B. P. Flannery, S. A. Teukolsky, and W. T. Vetterling, *Numerical Recipes in FORTRAN,* Second Edition, Cambridge University Press, Cambridge, 1992, pp. 595–596).

The first step in filtering the data is to transform them to wavelet space as $I_{\alpha\beta}$, where $\alpha$ and $\beta$ are two dimensional index vectors, each corresponding to wavelet's i and j (Equation (3)) per dimension. Note that Gaussian white noise with standard deviation $\sigma$ in position space stays as such in wavelet space due to the orthonormality and completeness of DWT functional basis.

Figure 1A:
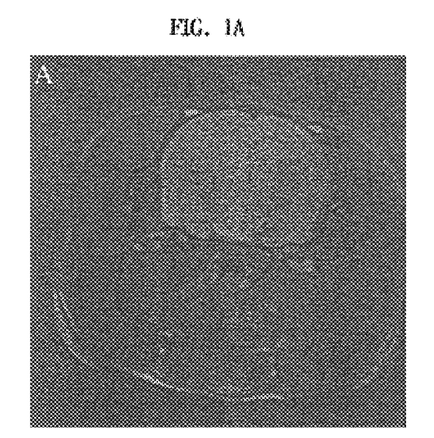
FIG. 1A is a raw coronal MRI slice of a rat brain.
Figure 1B:
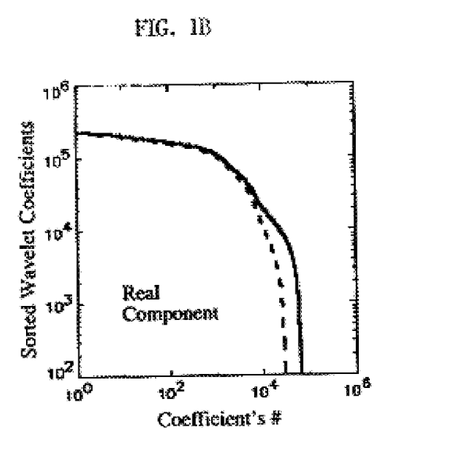
FIG. 1B is a sorted wavelet spectrum of the real part of the dataset of FIG. 1A.
Figure 1C:
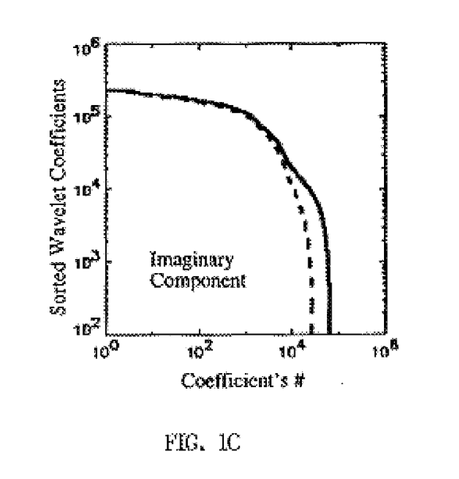
FIG. 1C is a sorted wavelet spectrum of the imaginary part of the dataset of FIG. 1A.
Figure 1D:
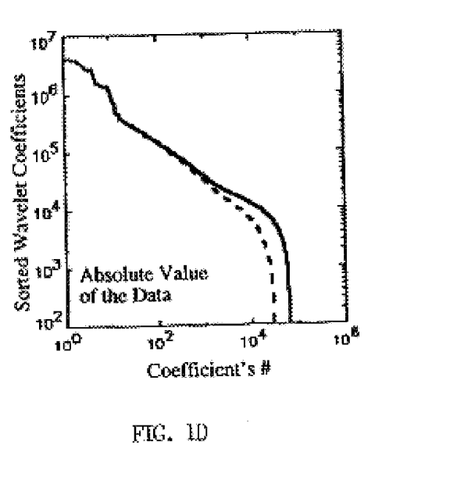
FIG. 1D is a sorted wavelet spectrum of the absolute value of the dataset of FIG. 1A.

To study the noise behavior, it is instructive to construct the data sorted wavelet spectrum (SWS), which is the amplitude list of the wavelet coefficients ranked in decreasing order. Referring now to the drawings, FIGS. 1B, 1C and 1D show sorted wavelet spectra of noisy real, imaginary and absolute value data from the same MRI dataset. The illustrated behavior is typical of MRI data, Inspection of the log-log plot of the noisy SWS of the real and imaginary parts of the data (solid line in FIGS. 1B & 1C) shows that these spectra have two regions. The first region consists of a modest decline on the high amplitude side of the spectrum, that breaks sharply into the second region: a lower amplitude region where the wavelet coefficients are dominated by the white noise. The break "level" is in accordance with the standard deviation of the image background noise. It should be noted that the SWS behaves differently when the absolute value of the data is considered, as shown in FIG. 1D. The SWS of FIG. 1D drops gradually into the noise instead of breaking sharply. This is in accordance with the above discussion of Equation (2).

With the onset of the noise dominated regime identified, an unbiased noise-free estimator of the signal in wavelet domain, $$\hat{I}_{\alpha\beta} = \hat{I}_{\alpha\beta}(I^{obs}_{\alpha\beta}, \lambda) \tag{8}$$

is obtained. D. L. Donoho ("De-noising via soft thresholding", *Technical report* 409, Dept. of Statistics, Stanford University, 1992) and D. L. Donoho and I. M. Johnstone ("Ideal spatial adaptation via wavelet shrinkage", *Biometrika,* Vol. 81, pp. 425–455, 1994) proposed the "soft" thresholding estimator $$\hat{I}_{\alpha\beta} = \text{sgn}(I^{obs}_{\alpha\beta})\max[(|I^{obs}_{\alpha\beta}| - \lambda), 0] \tag{9}$$

which "kills" noise prevalent coefficients and keeps, with $\lambda$ reduction, "true" signal dominated wavelet coefficients. The constancy of Gaussian white noise power spectrum over all resolution scales makes of the soft thresholding rule an ideal estimator. In the case illustrated in FIGS. 1A, 1B and 1C, the background noise level determines $\lambda$. For other wavelet based denoising schemes see, for example, D. L. Donoho and I. M. Johnstone, "Minimax estimation via wavelet shrinkage", *Technical Report No.* 402, Dept. of Statistics, Stanford University, 1992, and the above-cited paper by Hilton et al.

The data whose spectra are illustrated in FIGS. 1B, 1C and 1D were acquired as follows: A male Sprague-Dawley rat (250–350 gr) was anesthetized with pentobarbital i.p. (0.1 mg/100 gr) and put in a Bruker-Biospec 4.7T. The rat's head was secured in a home built head holder. A 5 cm volume coil was used. MR images were acquired using the fast spin echo technique (TR=3 sec, $Te_{eff}$=45 ms). In both cases, the matrix size was 256×256 with a 2 mm slice width. FIG. 1A shows a single coronal slice position at Bregma $\approx 2.5$. The spectra of FIGS. 1B, 1C and 1D correspond to this slice.

MR data consists of two orthogonal components, presented as real and imaginary parts of a complex number. Commonly, noise in MR images is assumed to be Gaussian, an assumption that holds for the real and imaginary components separately. As discussed above, in order to exploit the thresholding algorithm to its fullest potential the filtering should be applied separately to each component.

Each of the wavelet spectra shown in FIGS. 1B and 1C consists of two distinct regions, corresponding to signal dominated coefficients (high amplitude) and noise dominated coefficient (low amplitude). Independent measurement of the background noise level shows that its amplitude coincides with this SWS breakdown (FIGS. 1B and 1C), which supports the filtering approach of the present invention. The dashed lines in FIGS. 1B, 1C and 1D depict the filtered SWS used to reconstruct the image in each case. These lines were calculated using the soft thresholding method with the threshold λ taken as the background noise level of $10^4$.

FIGS. 2A–2D show the raw image (repeated) and various reconstructed images: 2A is the raw image before filtering. The image after filtering real and imaginary parts separately is displayed in FIG. 2B; it shows an apparent improvement in signal-to-noise ratio and contrast-to-noise ratio. The filtering method is applied to the raw data absolute values in FIG. 2C. Here, although there is an improvement in signal-to-noise ratio, the image seems to be somewhat smeared. For comparison an 8-averages image (of the same slice) is presented in FIG. 2D. The wavelet reconstruction program takes about a couple of seconds to run on a Silicon Graphics Indy-R5000 computer.

The image background signal-to-noise level is a good diagnostic for improvement of image quality. The background, on the image fringes, should give no signal. Due to the presence of noise, however, there is some non-zero background contribution. A good filtering algorithm ought to reduce this background signal in terms of both its mean and its standard deviation. A comparison of the background mean (<>) and standard deviation (σ) values of the images of FIGS. 2A–2D, yield the following approximate ratios: <A>:<B>:<C>:<D>=11:4:11:5 and $\sigma_A:\sigma_B:\sigma_C:\sigma_D$=6:2:3:3. These ratios show that filtering the real and imaginary components separately drives the background signal mean and standard deviation towards zero. Filtering absolute values alone improves σ but not the mean, which explains the apparent smearing in FIG. 2C. According to this diagnostic the filtered image is better than the 8-averages image, which indicates that the background mean and variance is not a sufficient test for determining image quality.

Figure 2A:
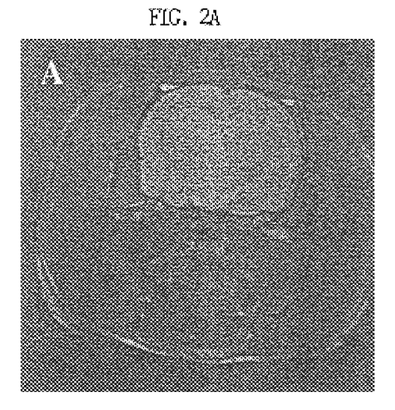
FIG. 2A is FIG. 1A repeated.
Figure 2B:
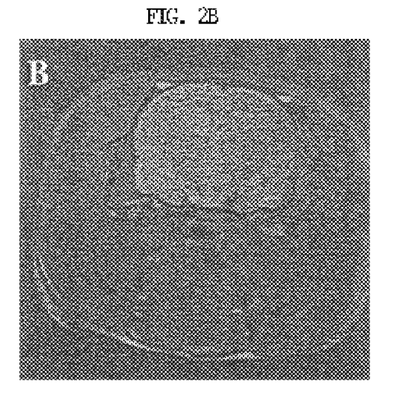
FIG. 2B is FIG. 1A after separate wavelet filtering of the real and imaginary parts.
Figure 2C:
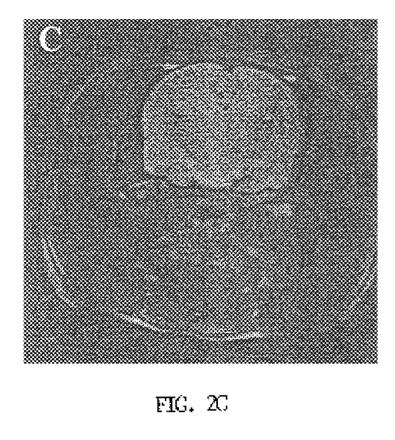
FIG. 2C is FIG. 1A after wavelet filtering of the absolute value.
Figure 2D:
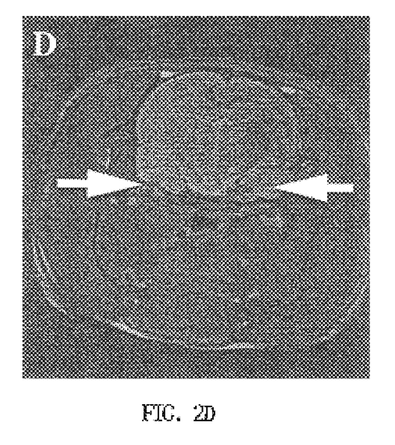
FIG. 2D is an average of 8 independent raw images of the slice of FIG. 1A.
Figure 3A:
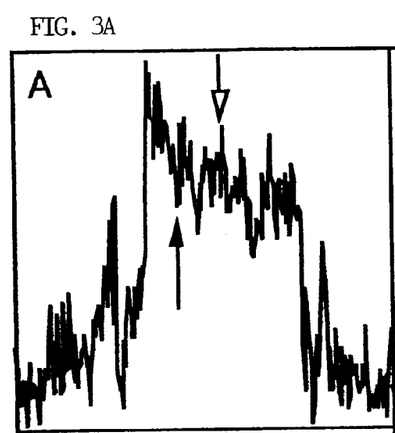
FIG. 3A is a line profile across FIG. 2A.
Figure 3B:
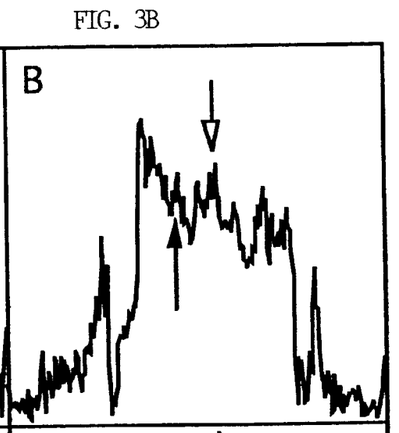
FIG. 3B is a line profile across FIG. 2B, corresponding to the profile of FIG. 3A.
Figure 3C:
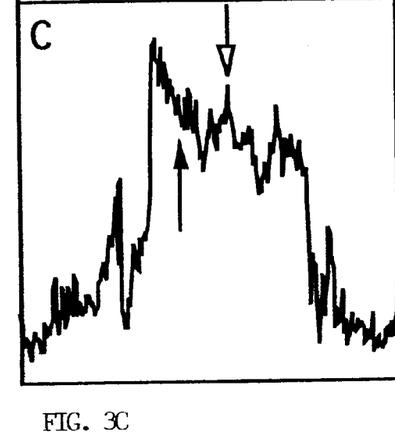
FIG. 3C is a line profile across FIG. 2C, corresponding to the profile of FIG. 3A.
Figure 3D:
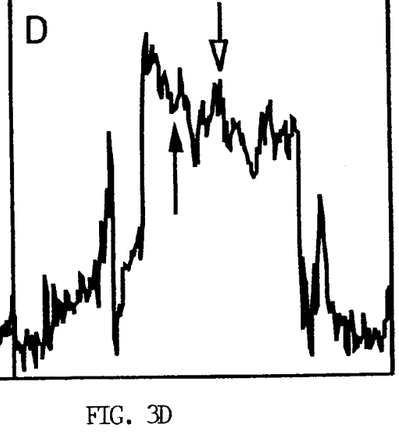
FIG. 3D is a line profile across FIG. 2D, corresponding to the profile of FIG. 3A.

Inspection of line profiles at an arbitrary direction along the images, marked with white arrows on FIG. 2D, demonstrates the larger improvement, in both signal-to-noise ratio and contrast-to-noise ratio, achieved by wavelet filtering of the real and imaginary data separately, as compared with the prior art wavelet filtering procedure. The line profiles of FIGS. 3C and 3D show improvement in background signal-to-noise ratio: The white headed arrows in the line profiles point toward a double peaked section in the line profiles if FIGS. 3B and 3D, vs. to a single peak in the line profiles of FIGS. 3A and 3C. The black headed arrows point to a valley that appears much cleaner and more pronounced in the line profiles of FIGS. 3B and 3D compared to the line profiles of FIGS. 3A and 3C.

Figure 4A:
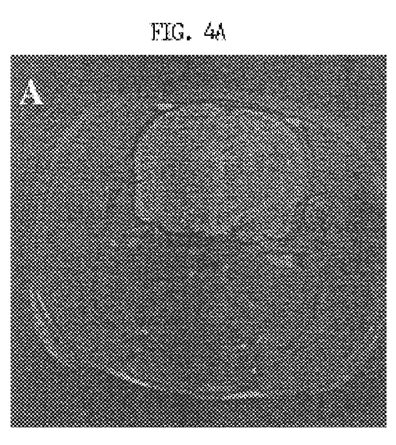
FIG. 4A is FIG. 2B repeated.
Figure 4B:
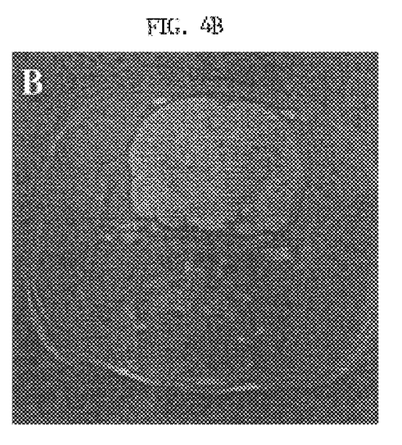
FIG. 4B is FIG. 1A after Gaussian smoothing.
Figure 4C:
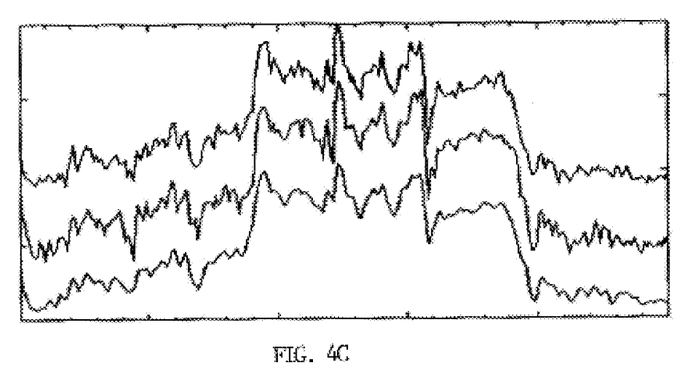
FIG. 4C shows corresponding line profiles across FIGS. 4A, 2D and 4B

Although the theoretical difference between wavelet filtering and other noise suppression methods is evident, it is useful to demonstrate it graphically in the simple Gaussian smoothing case. The image of FIG. 3B, repeated in FIG. 4A, is compared with an image filtered with a 2 pixel FWHM 2-dimensional Gaussian and shown in FIG. 4B. The smoothed image of FIG. 4B shows smeared features. Examination of corresponding line profiles along an arbitrary direction, shown in FIG. 4C, reveals the structure richness of the line profile of the 8-averages image of FIG. 3D (upper curve) and the line profile of the wavelet filtered image of FIG. 3B (middle curve) relative to the line profile of the Gaussian smoothed image (lower curve).

Conventionally acquired MRI datasets often include phase artifacts. These have no effect on conventional MRI processing, which uses only the absolute value of the input datasets. In the context of the present invention, however, these phase artifacts may be disastrous and must be accounted for. This is because the spatial scale of these artifacts is the same (order of one pixel) as the noises that are filtered by the present invention.

For example, the Bruker-Biospec 4.7T imager used to acquire the data of FIGS. 1–4 imposes two kinds of phase artifacts on the complex data $I_{j,k}$ at pixels indexed by the index pair (j,k). In spin echo mode, each datum $I_{j,k}$ is multiplied by a phase factor of the form exp(−πi(j+k)), where i is the square root of −1. In gradient echo FLASH mode, each datum $I_{j,k}$ is multiplied by both this phase factor and also by a phase factor of the form exp(−πim/4), where m is either j or k. These phase factors must be accounted for by multiplying the data $I_{jk}$ by the inverses of the phase factors.

Figure 5A:
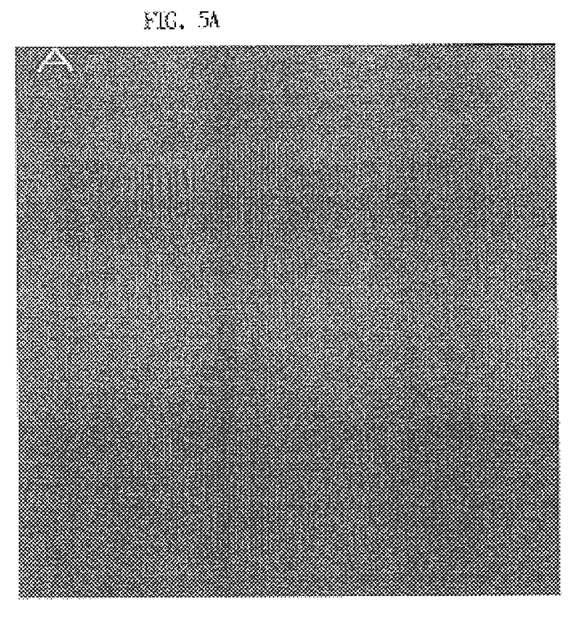
FIG. 5A is an image of a phantom sample without correction for phase artifacts.
Figure 5B:
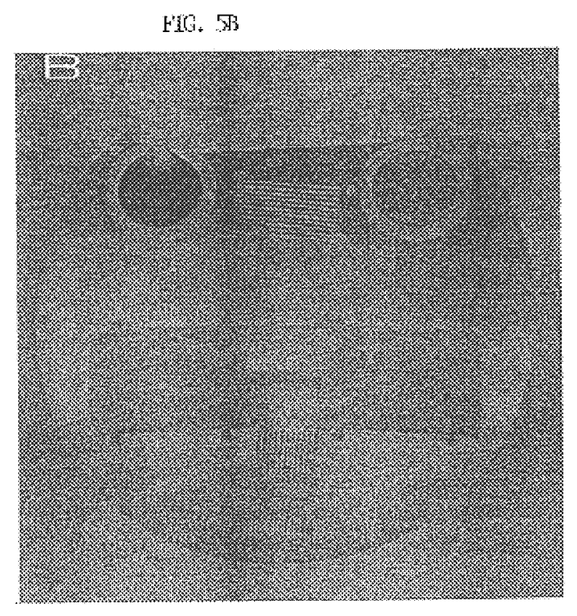
FIG. 5B is the image of FIG. 5A after correction for phase artifacts.
Figure 5C:
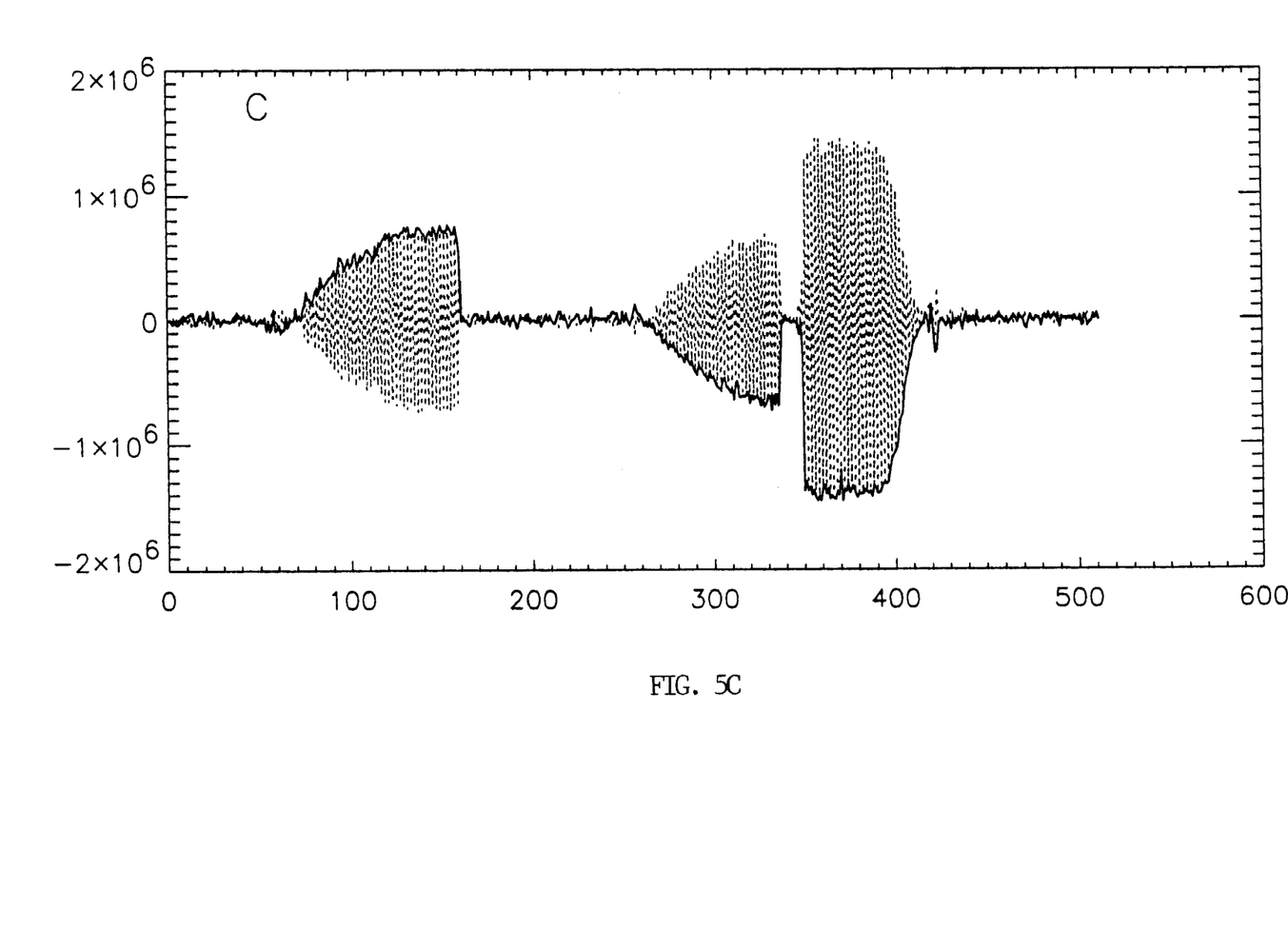
FIG. 5C shows horizontal lines across the images of FIGS. 5A and 5B.

FIG. 5A shows an image of a standard phantom sample acquired by the Bruker-Biospec 4.7T in gradient echo FLASH mode without correction for phase artifacts. FIG. 5B shows the same image after correction for phase artifacts. FIG. 5C shows one horizontal line through the real part of the dataset, as a function of horizontal index j, without (dotted) and with (solid) phase artifact correction.

While the invention has been described with respect to a limited number of embodiments, it will be appreciated that many variations, modifications and other applications of the invention may be made.

What is claimed is:

1. A method of imaging of an object, comprising the steps of:
   (a) acquiring a plurality of image datasets of the object;
   (b) for each of said image datasets:
      (i) transforming said each image dataset to a transform space, thereby providing a transformed image dataset,
      (ii) filtering said each transformed image dataset, thereby providing a filtered transformed image dataset, and
      (iii) inverting said transformation of said each filtered transformed image dataset; and
   (c) combining said inverted filtered transformed image datasets nonlinearly to produce an output image.

2. The method of claim 1, wherein said transformation is a wavelet transformation.

3. The method of claim 2, wherein said wavelet transformation is based on a Daubechies wavelet basis.

4. The method of claim 1, wherein each of said transformed image datasets includes a plurality of coefficients, and wherein said filtering is effected by steps including:
   (i) identifying said coefficients that are contaminated by noise; and
   (ii) zeroing said identified coefficients.

5. The method of claim 4, wherein said identifying and said zeroing are effected by thresholding.

6. The method of claim 1, wherein said plurality of image datasets includes a real part and an imaginary part of a magnetic resonance image.

7. The method of claim 6, further comprising the step of:
   (d) correcting said real part and said imaginary part of said magnetic resonance image for a phase artifact.

* * * * *